United States Patent [19]

Blumenfeld et al.

[11] Patent Number: 4,666,553

[45] Date of Patent: May 19, 1987

[54] METHOD FOR PLANARIZING MULTILAYER SEMICONDUCTOR DEVICES

[75] Inventors: Martin A. Blumenfeld, Tequesta, Fla.; Thomas F. A. Bibby, Jr., Plainsboro, N.J.

[73] Assignee: RCA Corporation, Princeton, N.J.

[21] Appl. No.: 770,275

[22] Filed: Aug. 28, 1985

[51] Int. Cl.⁴ .............................................. B44C 1/22
[52] U.S. Cl. .................................. 156/643; 156/652; 156/659.1
[58] Field of Search ............... 156/643, 648, 649, 651, 156/652, 657, 659.1

[56] References Cited

U.S. PATENT DOCUMENTS

| | | | |
|---|---|---|---|
| 4,377,438 | 3/1983 | Moriya et al. | 156/643 |
| 4,451,326 | 5/1984 | Gwozdz | 156/643 |
| 4,470,874 | 9/1984 | Bartush et al. | 156/643 |
| 4,489,481 | 12/1984 | Jones | 29/591 |
| 4,523,975 | 6/1985 | Groves et al. | 156/643 |
| 4,545,852 | 10/1985 | Barton | 156/643 |

Primary Examiner—S. Leon Bashore
Assistant Examiner—Michael K. Boyer
Attorney, Agent, or Firm—Birgit E. Morris; Donald S. Cohen; Kenneth R. Glick

[57] ABSTRACT

In accordance with the present invention a method for forming an insulating layer over a substrate surface comprises providing first and second raised portions extending from the substrate surface, the first and second portions extending distances $X_1$ and $X_2$ respectively, and $X_2$ being greater than $X_1$. An insulating layer of thickness $T_3$ is deposited over the surface so as to conform to the topography of the substrate surface and raised portions and a flowable layer is then deposited over the insulating layer. The flowable layer is next flowed so as to yield a substantially planar surface and then thinned until that portion of the insulating layer that overlies the second portion is exposed. The flowable layer and the exposed surface of the insulating layer are then simultaneously thinned so as to remove a greater thickness of flowable layer than insulating layer. The thinning is stopped when that portion of the insulating layer that overlies the first portion is exposed. At this point the exposed insulating layer is thinned until a thickness $D_1$ overlies the first portion and a thickness $D_2$ overlies the second portion. Thickness $T_3$ over the substrate surface is not reduced. This thinning is performed such that $|D_1-D_2|$, $|(D_1+X_1)-T_3|$ and $|(D_2+X_2)-T_3|$ are within predetermined ranges.

9 Claims, 5 Drawing Figures

METHOD FOR PLANARIZING MULTILAYER SEMICONDUCTOR DEVICES

The present invention relates to a method for fabricating multiple layers of dissimilar materials on the surface of a semiconductor device. More particularly, the invention relates to a method for forming a plurality of overlying metal layers on a semiconductor device surface having an irregular topography.

BACKGROUND OF THE INVENTION

A conventional semiconductor device typically incorporates multiple layers of a variety of materials on a major surface thereof. For example, to interconnect various portions of a semiconductor device a layer of conductive material in the form of one or more patterns of doped polycrystalline silicon or metal lines may be defined directly on the wafer surface. An insulating layer which might comprise, for example, silicon dioxide, silicon nitride, polyimide or some combination of materials typically overlies the conductive lines so as to provide electrical and physical protection. A second conductive layer, comprising one or more conductor lines, overlies the insulating layer and interconnects certain of the underlying conductor lines through apertures in the insulating layer. Furthermore, additional layers of alternating insulator and conductive layer may overlie the surface.

However, the fabrication of multilayer structures presents certain problems. When an insulating layer is disposed over a patterned conductor layer, the insulating layer will typically substantially conform to the topography of the conductor layer pattern. A second conductor layer pattern overlying the insulator layer will then conform to the topography of the insulator layer. When the insulator layer presents relatively high or steep "steps" along the contour thereof, problems such as cracking and incomplete coverage may occur in the overlying conductor layer. We have observed that these coverage problems may further be exacerbated when the underlying conductor layer comprises material(s) not having a uniform height across the wafer surface. In such a case there is the additional consideration of maintaining a relatively uniform insulator layer thickness between the underlying and overlying conductor lines while also minimizing the insulator layer step height, i.e. the difference between minimum and maximum elevations for adjacent portions of the insulator layer.

SUMMARY OF THE INVENTION

In accordance with the present invention a method for forming an insulating layer over a substrate surface comprises providing first and second raised portions extending from the substrate surface, the first and second portions extending distances, $X_1$ and $X_2$ respectively, and $X_2$ being greater than $X_1$. An insulating layer of thickness $T_3$ is deposited over the surface so as to conform to the topography of the substrate surface and raised portions and a flowable layer is then deposited over the insulating layer. The flowable layer is next flowed so as to yield a substantially planar surface and then thinned until that portion of the insulating layer that overlies the second portion is exposed. The flowable layer and the exposed surface of the insulating layer are then simultaneously thinned so as to remove a greater thickness of flowable layer than insulating layer. The thinning is stopped when that portion of the insulating layer that overlies the first portion is exposed. At this point the exposed insulating layer is thinned until a thickness $D_1$ overlies the first portion and a thickness $D_2$ overlies the second portion. Thickness $T_3$ over the substrate surface is not reduced. This thinning is performed such that $|D_1-D_2|$, $|(D_1+X_1)-T_3|$ and $|(D_2+X_2)-T_3|$ are within predetermined ranges.

DETAILED DESCRIPTION OF PREFERRED EMBODIMENT

Figure 1:
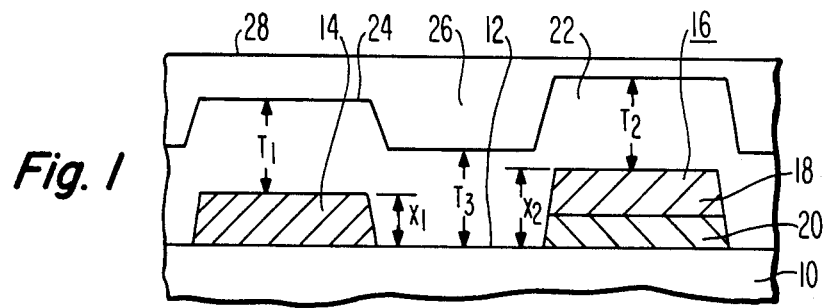
FIGS. 1-5 are cross sectional views which illustrate the process of the present invention.

As shown in FIG. 1, in the method of the present invention there is initially provided a substrate 10 having a substantially planar surface 12. In the preferred embodiment the substrate 10 is a semiconductor material such as silicon, although the material of the substrate is not critical to the present invention. Disposed on the surface 12 are first and second conductor lines, 14 and 16 respectively having thicknesses $X_1$ and $X_2$ respectively. In the illustrated embodiment, the first conductor line 14 comprises a metal such as aluminum and the second conductor line 16 comprises an upper portion 18 of a metal such as aluminum disposed on a lower portion 20 of a material such as doped polycrystalline silicon. The upper portion 18 of the second conductor 16 is of approximately the same thickness ($X_1$) as the first conductor line 14. Thus, the combined thickness of the upper portion 18 and lower portion 20 of second conductor line 16 extends from the surface 12 a greater distance than first conductor line 14 (i.e. $X_2 > X_1$). This is a common configuration in e.g., metal oxide semiconductor field effect transistors (MOSFETs) which utilize polycrystalline silicon gate electrodes.

Overlying the first and second conductor lines 14 and 16 is an insulator layer 22 of, for example, silicon dioxide, silicon nitride, phosphosilicate glass (PSG), borosilicate glass (BSG), borophosphosilicate glass (BPSG) or polyimide. When the insulator layer 22 is silicon dioxide, it may be applied, for example, by chemical vapor deposition (CVD) and yields a layer which follows the contour of the underlying layers. That is, the thickness of the insulator layer 22 over the first conductor line 14 (as identified at $T_1$) is equal to the thickness thereof over the second conductor line 16 (identified at $T_2$) and is equal to the thickness thereof over the substrate surface 12 (as identified at $T_3$). As will be elaborated upon herein, the thickness of the insulator layer 22 will be predetermined by the ultimate thickness desired. For example, when $X_1 \cong 7500$ Angstroms and $X_2 \cong 10,000$ Angstroms, the thickness $T_1(=T_2=T_3) \cong 15,000$ Angstroms.

Disposed across the surface 24 of the insulator layer 22 is a flowable layer 26 of a material such as photoresist. The structure of FIG. 1 is obtained by first applying the flowable layer 26 and then heating the flowable layer so as to cause it to flow and yield a substantially planar surface 28. The thickness of the flowable layer 26, as applied, should be such that after flowing all portions of the underlying insulator layer 22 are covered. Given the previously indicated thicknesses for the conductor lines and insulator layer, an appropriate thickness for the flowable layer 26 before flowing is approximately 15,000 Angstroms.

Figure 2:
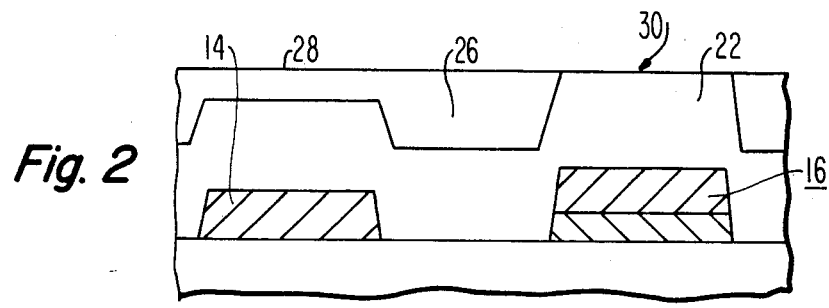
Figure 3:
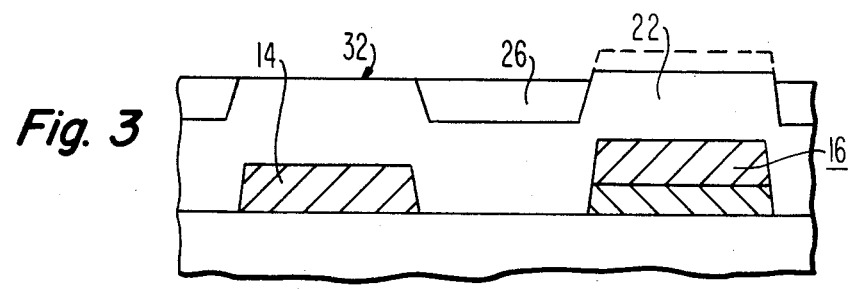
Figure 4:
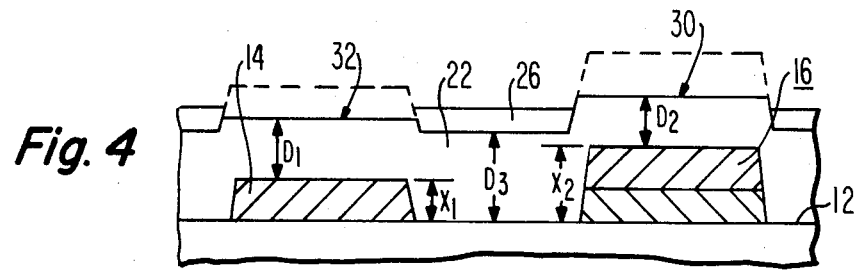

The structure of FIG. 1 is then placed in a plasma reactive ion etcher for what is basically a three stage process, yielding the structures illustrated in FIGS. 2 through 4. The process utilizes the principle that the relative etch rate of the flowable layer 26 and the insulator layer 22 can be varied depending upon various parameters within the plasma etcher. The three stages are performed sequentially, with the substrate remaining in situ within the reactor.

In Stage 1 of the cycle the flowable layer 26 is uniformly etched until that portion of the insulator layer 22 that overlies the second conductor line 16 is exposed. This exposed surface of the insulator layer 22 overlying the second conductor line 16 is identified at 30 in FIG. 2 and is substantially coincident with the planar surface 28 of the flowable layer 26. When the insulator layer 22 is a material that contains silicon, such as silicon dioxide, and the flowable layer is photoresist, conventional "endpoint detection" means may conveniently be used to determine when to complete the Stage 1 etching. Conventional endpoint detection techniques, such as detecting particular emissions spectra, can determine when the insulator layer is first exposed e.g. by detecting when silicon is being etched by the plasma.

In Stage 2 of the etching cycle, the flowable layer 26 and the exposed surface 30 are simultaneously thinned so as to remove a greater thickness of flowable layer 26 than insulator layer 22. The thinned portion of insulator layer 22 is illustrated in FIG. 3 by the broken line. This simultaneous thinning of the flowable layer 26 and surface 30 of the insulator layer is stopped when that portion of the insulator layer 22 that overlies the first conductor line 14, as identified at 32, is exposed.

In Stage 3 of the etching cycle, all of the exposed insulator layer 22 is etched until there is achieved a first thickness $D_1$ overlying the first conductor line 14, a second thickness $D_2$ overlying the second conductor line 16 and a third thickness $D_3$ overlying the substrate surface 12. The processing parameters during this third stage cause relatively little etching of the flowable layer 26 compared to the etching of the exposed surfaces 30 and 32 of the insulator layer 22. The etching is stopped when (1) the difference between thicknesses $D_1$ and $D_2$ falls within a first predetermined range and (2) the step heights $|(D_1+X_1)-D_3|$ and $|(D_2+X_2)-D_3|$ each fall within a second predetermined range. Given the previously used values for $X_1$, $X_2$, $T_1$, $T_2$ and $T_3$, the etching of the third stage should be stopped when $D_1 \cong 9000$ Angstroms and $D_2 \cong 7000$ Angstroms. The thickness $D_3$ will remain at its initial value, i.e. $D_3 = T_3 (\cong 15,000$ Å) since at the point at which the Stage 3 etching is stopped, a certain thickness of flowable layer 26 will typically remain over and protect the insulating layer between conductor lines. The first predetermined range, a measure of the uniformity of the insulator layer 22 which overlies the conductor lines, should be approximately 0 to 3000 Angstroms. In the cited example $|D_1-D_2|$ is 2000 Angstroms. The second predetermined range, representing a limitation on maximum step height, should be approximately 0 to 5000 Angstroms. In the cited example $|(D_1+X_1)-D_3| = 1500$ Angstroms and $|(D_2+X_2)-D_3| = 2000$ Angstroms.

Figure 5:
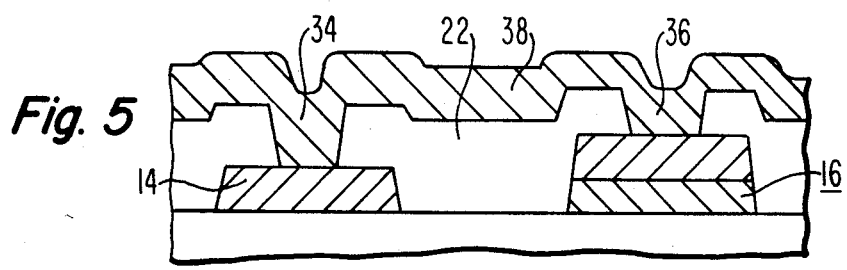

A more particular specification of the process parameters is as follows:

Stage 1 (primarily etching the flowable layer):
  Power density $\cong 0.62$ watts/cm$^2$
  Reactor Pressure $\cong 50$ millitorr
  CHF$_3$ flow rate $\cong 75$ std. cu. cm per min. (sccm)
  O$_2$ flow rate $\cong 75$ sccm
  Time $\cong 3.5$ minutes Stage 2 (etching flowable layer and insulating layer):
  Power density $\cong 0.62$ watts/cm$^2$
  Reactor Pressure $\cong 100$ millitorr
  CHF$_3$ flow rate $\cong 75$ sccm
  O$_2$ flow rate $\cong 95$ sccm
  Time $\cong 5$ minutes Stage 3 (primarily etching the insulator layer):
  Power density $\cong 0.62$ watts/cm$^2$
  Reactor Pressure $\cong 50$ millitorr
  CHF$_3$ flow rate $\cong 75$ sccm
  O$_2$ flow rate $\cong 40$ sccm
  Time $\cong 10$ minutes As illustrated in FIG. 5, the structure of FIG. 4 is then further processed by etching a via hole 34 in that part of the insulator layer 22 that overlies the first conductor line 14 and a via hole 36 in that portion of the insulator layer 22 which overlies the second conductor line 16. An overlying conductor layer 38 is then deposited so as to contact both conductor lines via the respective via holes and overlie the insulator layer 22 therebetween. The via holes 34 and 36 may be fabricated by conventional photolithographic pattern generation and etching. The overlying conductor layer 38 may be a material such as aluminum and may be deposited by conventional means such as evaporation or sputtering.

The method of the present invention enhances the manufacturing yield of devices produced thereby by providing excellent control over a variety of device parameters. The method permits thinning the insulator layer until the difference between $D_1$ and $D_2$ is within a predetermined range. This permits the formation of substantially uniformly sized via holes 34 and 36. If the difference in thickness between $D_1$ and $D_2$ is too great, then significant problems occur during the formation of the via holes and in subsequent processing. The method of the present invention also permits accurate control over the minimum thickness of the insulator layer, i.e. that portion overlying the higher conductor line, thereby insuring a minimum of dielectric insulation between the overlying conductor 38 and underlying second conductor line 16.

Furthermore, the method of the present invention permits accurate control over step heights in the insulator layer 22. In the illustrated embodiment there are two insulator layer step heights. They are defined as the difference between $(D_2+X_2)$ and $D_3$ i.e., $|(D_2+X_2)-D_3|$ and as the difference between $(D_1+X_1)$ and $D_3$ i.e., $|(D_1+X_1)-D_3|$. By appropriately controlling the etch rates during the three etch stages, the magnitude of step heights can be controlled, thereby reducing the likelihood of cracking in the conformal, overlying conductor.

Lastly, it should be noted that although the method of the present invention has been described in terms of forming an insulator layer between underlying and overlying conductor lines, the invention is not so limited. The invention has broader application. For example, what are referred to as first and second conductor lines 14 and 16 throughout this description need only be first and second raised portions on the surface 12. The raised portions need not be limited to metal.

What is claimed is:

1. A method for forming an insulating layer on a surface of a semiconductor device, comprising:

(a) providing, on the device surface, a first patterned feature of thickness $X_1$ and a second patterned feature of thickness $X_2$, wherein $X_2 > X_1$;

(b) forming a topographically conformal insulating layer of thickness $T_3$ over the patterned features and the surface, wherein $T_3 > X_2$;

(c) applying a flowable layer over the insulating layer;

(d) flowing the flowable layer so as to yield a substantially planar surface;

(e) substantially uniformly thinning the flowable layer until that portion of the insulating layer that overlies the second feature is exposed;

(f) simultaneously thinning the flowable layer and the exposed surface of the insulating layer that overlies the second feature so as to remove the flowable layer at a greater rate than the insulating layer;

(g) stopping said simultaneous thinning when that portion of the insulating layer that overlies the first feature is exposed; and (h) thinning the exposed insulating layer to a thickness $D_1$ over the first feature and a thickness $D_2$ over the second feature without reducing the thickness $T_3$ over said surface, such that the non-uniformity of insulating layer thickness $|D_1 - D_2|$ is within a first predetermined range and the maximum step heights $|(D_1 + X_1) - T_3|$ and $|(D_2 + X_2) - T_3|$ are within a second predetermined range.

2. A method in accordance with claim 1 wherein said first predetermined range is 0 to 3000 Angstroms and said second predetermined range is 0 to 5000 Angstroms.

3. A method in accordance with claim 1 wherein $T_3$ is approximately twice $D_2$.

4. A method in accordance with claim 1 wherein said insulating layer is silicon dioxide.

5. A method in accordance with claim 1 wherein said flowable layer is photoresist.

6. A method in accordance with claim 1 wherein $X_1 \cong 7500$ Å, $X_2 \cong 10,000$ Å, $T_3 \cong 15,000$ Å, $D_1 \cong 9000$ Å and $D_2 \cong 7000$ Å.

7. A method in accordance with claim 1 wherein all of said thinning steps are performed in situ in a plasma reactive ion etcher.

8. A method in accordance with claim 1 wherein said first and second patterned features comprise conductor lines.

9. A method in accordance with claim 8 wherein said first patterned features comprises polycrystalline silicon and said second patterned feature comprises metal disposed on polycrystalline silicon.

* * * * *